(12) United States Patent
Agarwal et al.

(10) Patent No.: US 7,834,649 B2
(45) Date of Patent: Nov. 16, 2010

(54) METHOD AND APPARATUS FOR STATISTICAL CMOS DEVICE CHARACTERIZATION

(75) Inventors: Kanak B. Agarwal, Austin, TX (US);
Jerry D. Hayes, Georgetown, TX (US);
Ying Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/779,038

(22) Filed: May 12, 2010

(65) Prior Publication Data

US 2010/0225348 A1    Sep. 9, 2010

Related U.S. Application Data (62) Division of application No. 12/141,862, filed on Jun. 18, 2008, which is a division of application No. 11/736,146, filed on Apr. 17, 2007, now Pat. No. 7,397,259.

(51) Int. Cl.
*G01R 31/26* (2006.01)
(52) U.S. Cl. ............... 324/768; 324/765; 324/158.1
(58) Field of Classification Search .............. 324/158.1, 324/525, 527–528, 754–758, 763; 257/48, 257/529, 797, 301–305; 438/14–18
See application file for complete search history.

(56) References Cited

U.S. PATENT DOCUMENTS 6,838,869 B1   1/2005   Rogers et al.
6,975,103 B1*  12/2005  Blom ................ 324/99 D
7,208,759 B2   4/2007   Momohara
7,336,085 B2   2/2008   Fabbro et al.
7,339,364 B2   3/2008   Kam et al.
7,408,372 B2   8/2008   Agarwal et al.
7,589,538 B2*  9/2009   Novikov et al. ........... 324/676

OTHER PUBLICATIONS

L. Vendrame et al., "Crosstalk-Based Capacitance Measurements; Theory And Applications," IEEE Transactions on Semiconductor Manufacturing, vol. 19, No. 1, Feb. 2006.
B. McGaughy et al., "A Simple Method for On-Chip Sub-Femto-Farad Interconnect Capacitance Measurement," IEEE Electron Device Letters, vol. 18, No. 1 (Jan. 1997).

* cited by examiner

*Primary Examiner*—Minh N Tang
*Assistant Examiner*—Trung Q Nguyen
(74) *Attorney, Agent, or Firm*—Libby Z. Handelsman; Jack V. Musgrove (57) ABSTRACT

A unified test structure having a large number of electronic devices under test is used to characterize both capacitance-voltage parameters (C-V) and current-voltage parameters (I-V) of the devices. The devices are arranged in an array of columns and rows, and selected by control logic which gates input/output pins that act variously as current sources, sinks, clamps, measurement ports and sense lines. The capacitance-voltage parameter is measured by taking baseline and excited current measurements for different excitation voltage frequencies, calculating current differences between the baseline and excited current measurements, and generating a linear relationship between the current differences and the different frequencies. The capacitance is then derived by dividing a slope of a line representing the linear relationship by the excitation voltage. Different electronic devices may be so tested, including transistors and interconnect structures.

3 Claims, 6 Drawing Sheets

METHOD AND APPARATUS FOR STATISTICAL CMOS DEVICE CHARACTERIZATION

CROSS-REFERENCE TO RELATED APPLICATIONS

This application is a divisional of U.S. patent application Ser. No. 12/141,862 filed Jun. 18, 2008, which is a divisional of U.S. patent application Ser. No. 11/736,146 filed Apr. 17, 2007, now U.S. Pat. No. 7,397,259.

BACKGROUND OF THE INVENTION

1. Field of the Invention

The present invention generally relates to the design and testing of integrated circuits, and more particularly to a method and system for testing an array of a large number of electronic devices such as transistors formed on an integrated circuit for statistical characterization.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

Faster performance and predictability of responses are elements of interest in integrated circuit design. As process technology scales to the deep-submicron (DSM) regime, it is becoming increasingly important for the performance and reliability of IC chips and systems to understand how variations in process parameters affect the operation of an electronic device or circuit. In particular a designer needs to model responses such as current flow or capacitance with changes in voltage (I-V and C-V curves) for transistors, and resistance/capacitance measurements for wiring. Device testing may further include leakage measurements across a gate, to indirectly assess the quality of an oxide material and identify potential flaws like pin holes or edge defects. Some devices such as static random-access memory (SRAM) require testing the memory elements with random fluctuations in threshold voltages to better characterize the circuit. Devices should also be stress tested, i.e., under different conditions such as varying temperatures.

It is additionally useful to understand how spatial variations (e.g., devices located in different dies on a single wafer) can be affected by process parameters. Conventional testing systems provide for the measurement of some process parameters using an array having a large number of the same devices for statistical characterization purposes. These systems have for example transistors arranged in addressable rows and columns. Selector control logic allows parameters of interest such as voltage or current to be injected at a desired device under test (DUT) node, and the outputs of the DUTs are routed through appropriate selectors to a measurement unit.

Circuit designers make assumptions about spatial variations of parameters which have a significant impact on product performance, but there is often no reliable system for verifying these assumptions. While the some test structures provide a fair basis to generally characterize the response of the devices, the measurements are not completely accurate since they fail to take into consideration various effects on signal creation and transmission. Even metal wires have a very small resistance (as well as capacitance) that affects the propagation of signals in the wires. These loading effects can vary with wire length and environmental parameters such as temperature. Calibration of the measurement circuitry does not compensate for variations in the loading effects. Moreover, spatial variability in integrated circuits is becoming worse due to variations such as Leff variation, doping concentrations, spurious leakage, systematic variation due to chemical mechanical planarization, etc. Existing test structures cannot adequately account for the variability in these measurements. In order to reliably characterize the variabilities, hundreds of samples are needed, which is even more impractical given the limited number of input/output (C4) pads provided on the circuits. Prior art test systems mostly provide only a few transistors on the kerf structure to monitor long-distance variabilities (wafer-to-wafer or die-to-die).

Figure 1:
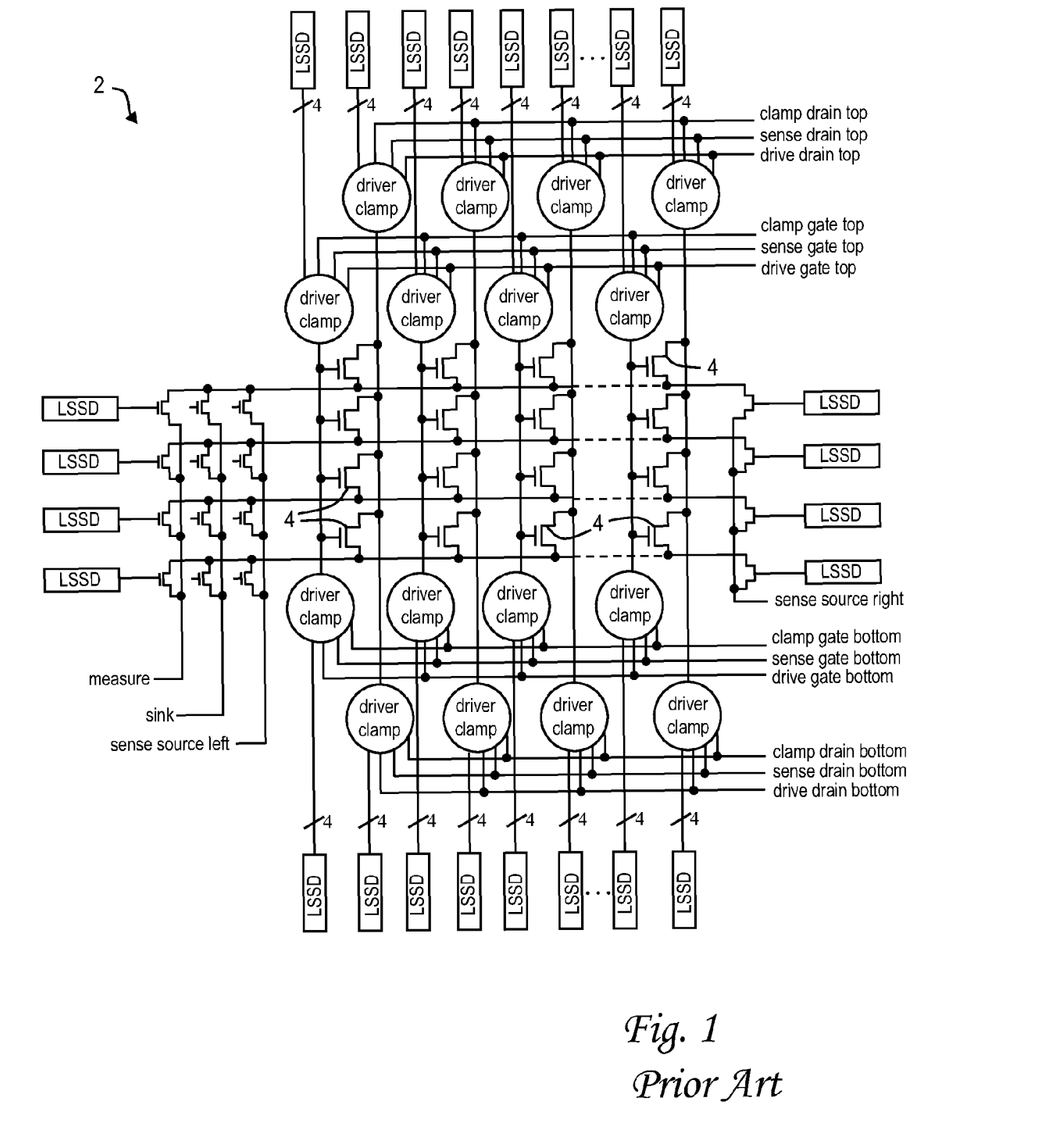
FIG. 1 is a schematic diagram of a conventional test structure having an array of devices under test, which uses column/row addressing and current steering to derive a current versus voltage (I-V) measurement.

One test system which provides superior measurement of current/voltage response (I-V) is disclosed in U.S. patent application Ser. No. 11/422,913 filed Jun. 8, 2006, which is hereby incorporated. FIG. 1 illustrates one embodiment of that invention. The test circuit 2 includes a plurality of transistors (DUTs) 4 arranged in rows and columns, with each column being driven at its top and its bottom by four driver/clamps (two for the gate line and two for the drain line). Each driver/clamp has three voltage lines: a clamp input, a drive input, and a sense output. The driver/clamps are selectively controlled by level-sensitive scan design (LSSD) latches which are set by the test software. The sense signal from a driver/clamp provides a high impedance output which can be used to measure the voltage being applied at the top or bottom end of the column. The sense output is used to calibrate the drive or clamp signals, and can be used to dynamically monitor those signals and compensate for voltage strength variations by using the sense signal as an input to a feedback loop that adjusts the power supply for the drive or clamp voltages. Another set of LSSD latches on the left side acts as a current steering circuit to selectively direct the current from the row of the selected DUT to a measuring pin, while the currents of the remaining (non-selected) rows are directed to a sink pin. These steering devices lie in series between the source terminal of the DUT and electrical ground, causing the row voltages to rise slightly above ground. The parasitic resistance of the wire also adds an additional resistance between the source node of the DUT and the steering device. To account for these resistive voltage (IR) drops, sense capability is added to measure the row voltages at both ends of the array.

The current steering in this prior test circuit 10 is advantageous because the sense voltage at the right side may be used as a measure of the exact voltage appearing at the source node of the selected DUT. This current steering allows the measurement of extremely low currents (for example, gate leakage) of a DUT embedded in an array of devices. The difference between the sense voltages at the two ends of a row can further be used as an indicator of the IR drop due to parasitic resistances. Thus any voltage measurement for the device under test may be calibrated by deriving the difference between the sensed voltages at the left and right ends of the selected row and providing this difference to the measurement unit.

While the system of FIG. 1 is useful for characterizing the I-V response of a device, it does not provide any capacitance measurements and in particular does not yield any capacitance/voltage (C-V) relationships. The correlation between I-V and C-V curves for a device can provide significant insight into the root causes of variability and can be used to build a better variability device model. There are methods for measuring capacitance parameters but they suffer from certain limitations and disadvantages.

For front-end of line (FEOL) testing, i.e., at the device level, capacitance is measured using a standard instrument such as a Keithley Model 950 analyzer. That analyzer measures capacitance versus voltage as well as capacitance versus time characteristics of semiconductor devices using a direct-current (DC) bias and a small alternating-current (AC) signal measurement. These types of instruments suffer inaccuracies due to parasitic capacitances, and elaborate procedures must be followed to minimize the parasitic effects. This instrument is also unsuitable for testing of large arrays of devices.

For back-end of line (BEOL) testing, i.e., at the interconnect level, capacitance measurement is charge-based. See, e.g., the article "A Simple Method for On-Chip Sub-Femto-Farad Interconnect Capacitance Measurement" by B. McGaughy et al., IEEE Electron Device Letters, vol. 18, no. 1 (January 1997). In that method two non-overlapping AC signals are sent along two identical wire branches that gate current to an output node where capacitance is measured. The difference in capacitance measured with each signal is adjusted based on the signal frequency and magnitude to yield the BEOL capacitance. This technique requires careful timing of the AC signals as well as precise matching between the two wire branches.

Capacitance can alternatively be measured using coupling effects as explained in the article "Crosstalk-Based Capacitance Measurements: Theory and Applications" by L. Vendrame et al., IEEE Trans. on Semiconductor Mfg., vol. 19, no. 1 (February 2006). According to that method cross-coupling capacitances are extracted by measuring crosstalk currents. This technique similarly requires careful signal timing, and has poor accuracy if the capacitor used in the test has any leakage. It is also unsuitable for testing of large arrays of devices.

As a further disadvantage, none of the foregoing techniques can be implemented in a circuit that also allows I-V testing of the same devices. It would, therefore, be desirable to devise an improved testing structure which could accurately measure the capacitances of devices in a large test array. It would be further advantageous if the same testing structure could be used to evaluate I-V curves for the DUTs.

SUMMARY OF THE INVENTION

It is therefore one object of the present invention to provide an improved method for measuring capacitance parameters of semiconductor devices such as capacitance versus voltage (C-V).

It is another object of the present invention to provide such a method that is suitable for testing an array having a large number of devices for statistical characterization.

It is yet another object of the present invention to provide a test structure which can be used to measure both I-V and C-V characteristics for the same devices.

The foregoing objects are achieved in a method of testing an array of electronic devices arranged in columns and rows in an integrated circuit by selectively measuring a capacitance-voltage parameter for each of the electronic devices in the array and selectively measuring a current-voltage parameter for each of the electronic devices in the same array, using column/row addressing logic which gates input/output pins at a periphery of the array. The input/output pins act variously as current sources, sinks, clamps, measurement ports and sense lines depending on the particular implementation. The column/row addressing logic advantageously lies outside the periphery of the array. The current-voltage parameter is measured using current steering to direct current flow from a first node of a selected electronic device to a measurement unit while directing current flow from other electronic devices to a sink, and using voltage sensing to calibrate a reference voltage which is applied to a second node of the selected electronic device. The capacitance-voltage parameter is measured by taking baseline and excited current measurements for different excitation voltage frequencies, calculating current differences between the baseline and excited current measurements, and generating a linear relationship between the current differences and the different frequencies. The capacitance is then derived by dividing a slope of a line representing the linear relationship by the excitation voltage. Different electronic devices may be so tested, including transistors and interconnect structures.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention is directed to a novel method and test system for measuring capacitances of an array of devices such as transistors in an integrated circuit to allow statistical characterization of capacitance parameters such as capacitance versus voltage (C-V). The same circuit can advantageously be employed to test current parameters such as current versus voltage (I-V) using current steering. The structures disclosed herein are useful for such statistical characterization of intrinsic parameter fluctuations in metal-oxide semiconducting field-effect transistor (MOSFET) devices. The test structures feature a large array of densely populated SRAM-sized devices that allow fast and precise measurement of electrical characteristics of each individual device. These structures may be used to characterize the variations in device parameters for different threshold implantation levels in a 65 nm silicon-on-insulator (SOI) process.

For the capacitance measurements, a baseline current measurement is first taken at a reference node of the device under test (DUT) to represent the effects of all parasitics while the reference node is driven by a periodic voltage signal. A selected node of the DUT is then excited at the same frequency of the reference signal, the current is again measured and the difference between the two currents is recorded with the excitation frequency. This process is repeated for several excitation frequencies to establish a linear relationship between the change in current and frequency. The slope of this line together with the magnitude of the excitation is indicative of the DUT capacitance.

Figure 2A:
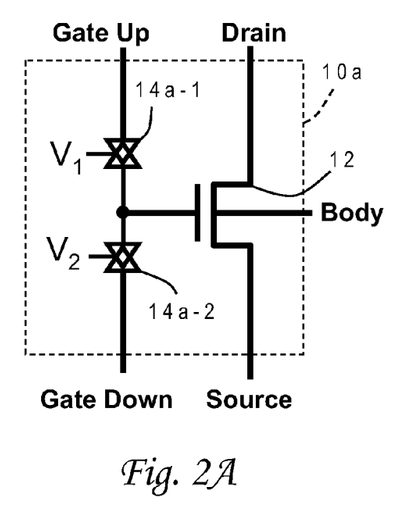
FIG. 2A is a schematic diagram of a test cell constructed in accordance with one embodiment of the present invention, used in measuring gate-to-drain, gate-to-body and gate-to-source capacitances of a device under test.
Figure 2B:
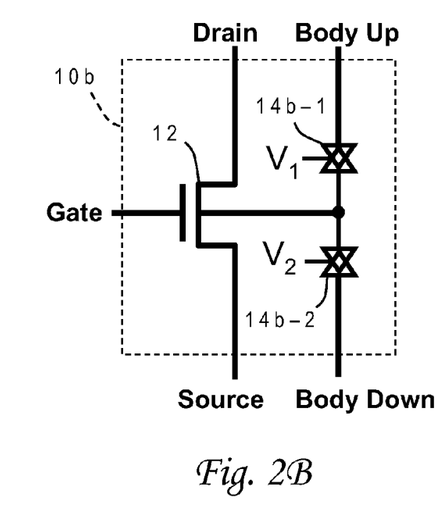
FIG. 2B is a schematic diagram of a test cell constructed in accordance with another embodiment of the present invention, used in measuring drain-to body and source-to-body capacitances of a device under test.
Figure 3:
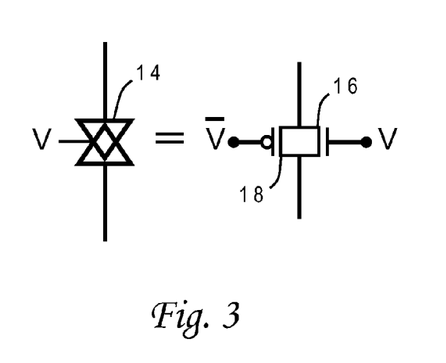
FIG. 3 is a detail view of the pass gate structure used in the test cell embodiments of the present invention.

The present invention may be implemented using different test cells embodiments depending upon the particular testing desired (e.g., FEOL vs. BEOL) and the particular capacitance being measured for devices such as transistors having different capacitance parameters. FIGS. 2A and 2B illustrate two test cells 10a and 10b that may be used for FEOL testing, i.e., at the transistor level. Test cell 10a includes a DUT 12 having a drain node, a body node, a source node, and a gate node. The gate node of DUT 12 is driven by the outputs of two pass gates 14a-1 and 14a-2. Pass gates 14a-1 and 14a-2 switch the gate of DUT 12 between respective reference voltages "Gate Up" and "Gate Down" based on the gating signals $V_1$ and $V_2$. As shown in FIG. 3, the pass gates 14 consist of an n-type transistor 16 whose drain and source nodes are respectively connected to the drain and source nodes of a p-type transistor 18. The gate of n-type transistor 16 is controlled by the voltage signal, and the gate of p-type transistor 18 is controlled by the logical complement of the voltage signal.

Figure 4A:
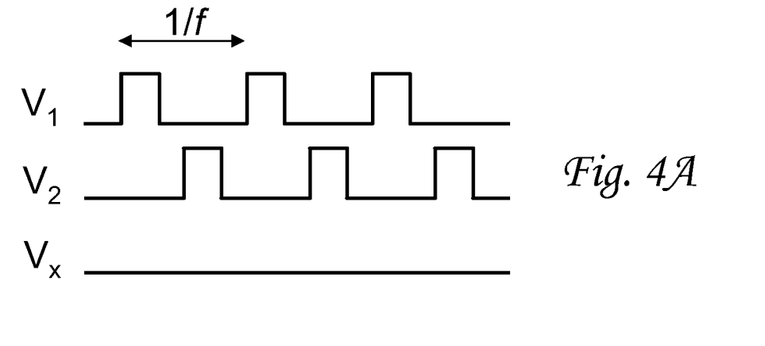
FIGS. 4A and 4B are timing diagrams showing three voltage signals that are used respectively during a baseline current measurement and an excited current measurement in accordance with one implementation of the present invention.
Figure 4B:
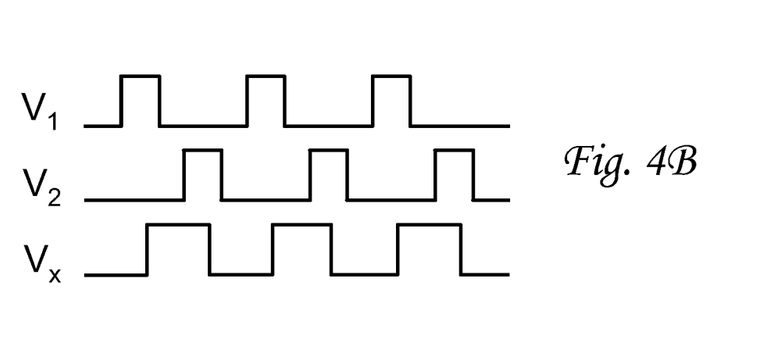

The pass gates 14a-1, 14a-2 are strobed while an excitation voltage $V_X$ is selectively applied to one of the nodes of DUT 12 depending upon which capacitance parameter is of interest, and current is measured at the current source (either Gate Up or Gate Down depending on the implementation). For gate-to-drain capacitance ($C_{gd}$) the excitation voltage is applied to the drain node of DUT 12; for gate-to-body capacitance ($C_{gb}$) the excitation voltage is applied to the body node of DUT 12; for gate-to-source capacitance ($C_{gs}$) the excitation voltage is applied to the source node of DUT 12. However, before applying the excitation voltage a baseline current measurement is taken. For example, a first current measurement is taken at the Gate Up current source while the $V_1$ and $V_2$ signals oscillate and $V_X$ remains quiet as seen in the timing diagram of FIG. 4A. The second (excited) current measurement is taken at the same current source while the $V_1$ and $V_2$ signals oscillate and $V_X$ is excited as seen in the timing diagram of FIG. 4B. The difference between these two current measurements ($\Delta I$) is recorded along with the frequency f of the strobe/excitation signals. The duty cycle of the signals is not critical, although the $V_1$, $V_2$ signals preferably do not overlap.

Figure 5:
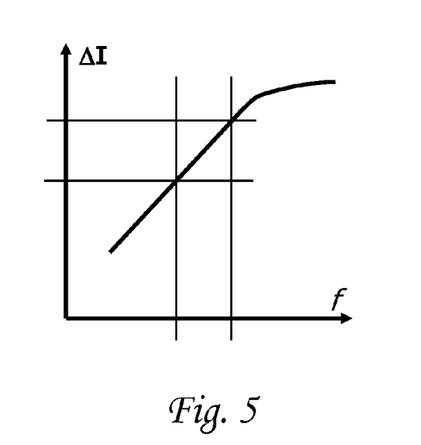
FIG. 5 is a graph of a linear relationship that is generated from the differences in baseline and excited currents versus the frequency of the voltage signals in accordance with one implementation of the present invention.

This process is repeated for different frequency values to derive corresponding current difference values, and the data points are plotted as shown in FIG. 5 to generate a linear relationship between $\Delta I$ and f. The slope of the resulting line ($d\Delta I/df$) represents the amount of charge Q stored at DUT 12 and so can be used to calculate capacitance according to the equation Q=C*V, i.e., the capacitance is equal to the slope of the line divided by $V_X$. While this relationship is generally linear, if the frequency becomes too large the switches will fail to completely turn on and the $\Delta I$ vs. f slope will start to level off. For optimal measurement accuracy it is preferable to use the slope at a higher frequency but before the curvature begins, so a low frequency is chosen at first and incremented until the current difference stops increasing, and then the last couple of data points are discarded and the next highest ones used to establish the slope. This procedure may be formulaic using a threshold $\Delta I$ value to decide when the current has stopped increasing or may be performed manually by the designer picking the data points for the slope after a visual inspection of the data points. C-V curves for the DUTs are established by monitoring capacitance responses for varying excitation voltages.

The minimum frequency is preferably determined according to leakage considerations. In an exemplary test procedure for sub-nanometer DUTs, the starting frequency for f is 100 MHz with a frequency increment of 10 MHz using an excitation voltage $V_X$ of 0.6 volts, strobing voltages $V_1$, $V_2$ of 1.0 volts, and reference voltages Gate Up, Gate Down of zero volts. The reference voltages can be adjusted to yield capacitance measurements for different bias points.

The same test procedure is used with the alternative test cell 10b of FIG. 2B in which the body node of DUT 12 is driven by the outputs of two pass gates 14b-1 and 14b-2. Pass gates 14b-1 and 14b-2 switch the body of DUT 12 between respective reference voltages "Body Up" and "Body Down" based on the gating signals $V_1$ and $V_2$. For drain-to-body capacitance ($C_{db}$) the excitation voltage is applied to the drain node of DUT 12; for source-to-body capacitance ($C_{sb}$) the excitation voltage is applied to the source node of DUT 12. Measurements are taken in the same manner for different sets of $\Delta I$ and f to construct the linear relationship and derive the capacitance by dividing the slope by the excitation voltage.

Figure 6:
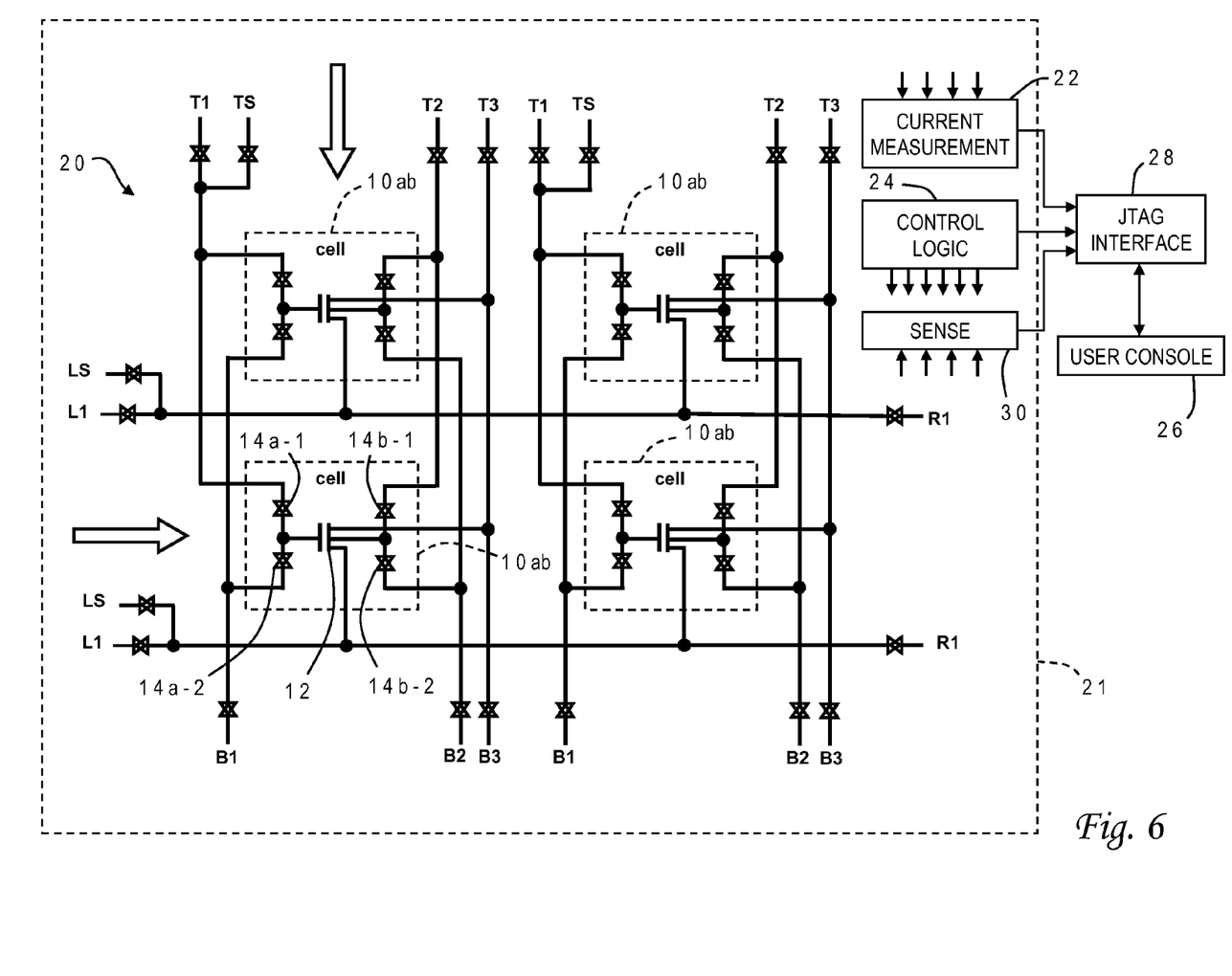
FIG. 6 is a schematic diagram of a test structure for measuring front-end of line (FEOL) capacitances in accordance with one embodiment of the present invention.

With reference now to FIG. 6, there is depicted one embodiment of a test structure 20 for measuring FEOL capacitances which uses test cells 10ab that consolidate the features of test cells 10a and 10b. Test structure 20 is formed in an integrated circuit (IC) chip 21. Each test cell 10ab has a transistor under test 12, a first set of pass gates 14a-1, 14a-2 connected to the gate node of transistor 12, and a second set of pass gates 14b-1, 14b-2 connected to the body node of transistor 12. Additional pass gates are used to couple respective input/output pins T1, T2, T3, TS, B1, B2, B3, L1, L2 and R1 to test structure 20. Pins T1 and TS are selectively connected to pass gate 14a-1, pin T2 is selectively connected to pass gate 14b-1, pins T3 and B3 are selectively connected to the drain node of transistor 12, pin B1 is selectively connected to pass gate 14a-2, pin B2 is selectively connected to pass gate 14a-1, pins L1 and LS are selectively connected to the source node of transistor 12 from the left side of the circuit and pin R1 is selectively connected to the source node of transistor 12 from the right side of the circuit. Pins beginning with "T" are at the top of the array, pins beginning with "B" are at the bottom, pins beginning with "L" are at the left side, and pins beginning with "R" are at the right side.

For gate capacitance measurements ($C_{gs}$, $C_{gb}$, $C_{gd}$), pin T1 is the current source while pin B1 is the current sink, pin TS is used as an external gate clamp while pin LS is the source clamp, and the remaining pins are used as aggressors depending on the particular capacitance parameter being measured, i.e., T2 and B2 are body aggressors, T3 and B3 are drain aggressors, and L1 and R1 are source aggressors. Pin T1 is the measurement port for gate testing and is connected to a current measurement circuit 22. For body (bulk) capacitance measurements ($C_{sb}$, $C_{db}$), pin T2 is the current source while pin B2 is the current sink, pin TS is again used as an external gate clamp while pin LS is the source clamp, pins T1 and B1 are set to the same gate bias voltage, pins T3 and B3 are drain aggressors, and pins L1 and R1 are source aggressors. Pin T2 is the measurement port for body testing and is connected to current measurement circuit 22.

Test cells 10ab are arranged in columns and rows, and a particular test cell is selected for testing using column and row addressing carried out by on-chip control logic 24 which turns on or off the appropriate pin gates. Control logic 24 may for example include a signal generator and scan latches as described more fully in U.S. patent application Ser. No. 11/422,913 filed Jun. 8, 2006, which is hereby incorporated. The scan latches are set by a test program running on a workstation or user console 26 through an interface port such as a JTAG interface 28. The voltage signals are applied to various nodes of transistor 12 as described above according to the particular testing desired to derive the ΔI data points, which are transmitted to user console 26. The test program running at the console then derives the linear relationship, computes the capacitance parameter of interest, and outputs the result to the user. The size of the array may vary; although only two rows and two columns are shown, an exemplary array might have 1,000 columns and 96 rows, for a total of 96,000 testable devices.

Test structure 20 can also measure gate leakage of the transistors under test. For such measurements pin TS is used as the gate current sink of horizontal devices, while pin B1 is used as the gate current sink of vertical devices. Pin T1 is the measurement port. The voltages at pins T1, TS and B1 can be set equal for device isolation.

Test structure 20 is further advantageously used to measure I-V response by employing the current steering described more fully in U.S. patent application Ser. No. 11/422,913. For I-V measurements, pins T1 and B1 are used as the gate drive and sense, pins T2 and B2 are used as the body drive and sense, pins T3 and B3 are used as the drain drive and sense, and pins L1 and R1 are used as the source drive and sense. Pin TS is again used as an external gate clamp while pin LS is the source sink. Current from pin L1 or pin T3 of the DUT (depending upon which of those pins is driving the current) is steered to the measurement unit while those pins from non-selected DUTs are directed to a sink. The sense voltages at B1, B2, B3 and R1 may be used as a measure of the exact voltage appearing at the selected node of the transistor under test. These sense lines are connected to an on-chip voltage sense unit 30 which sends the sense data through JTAG interface 28 to user console 26. The sense output can be used to calibrate the drive or clamp signals, or can be used to dynamically monitor those signals and compensate for voltage strength variations by using the sense signal as an input to a feedback loop that adjusts the power supply for the drive or clamp voltages. The I-V measurements can take place before or after the C-V measurements as part of a unitary test procedure. I-V curves for the DUTs are established by monitoring current responses at the drive lines for varying voltage inputs.

Figure 7:
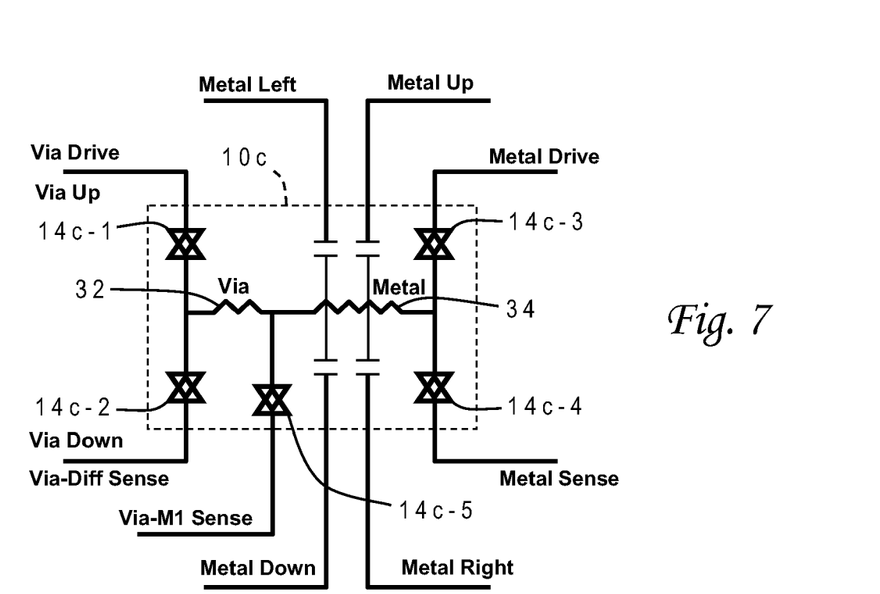
FIG. 7 is a schematic diagram of a test cell constructed in accordance with yet another embodiment of the present invention, used in measuring interconnect capacitance of a device under test.

The present invention can be applied to BEOL testing as well, i.e., at the interconnect level. FIG. 7 illustrates another alternative test cell 10c having a via 32 and a wire 34 (e.g., metal-1) which together constitute the DUT. Two pass gates 14c-1 and 14c-2 are used to connect via 32 to a Via Up reference voltage that may act as a drive line, and to a Via Down reference voltage that may act as a sense line. Two other pass gates 14c-3 and 14c-4 are used to connect wire 34 to a metal drive line and a metal sense line. A fifth pass gate 14c-5 is connected to the node between via 32 and wire 34 for voltage sensing. Four aggressor inputs are also provided to drive Metal Up, Metal Down, Metal Left and Metal Right. As further explained in conjunction with FIG. 8, test cell 10c may be used in an AC operation to measure capacitance, or in a DC operation to measure resistance.

Figure 8:
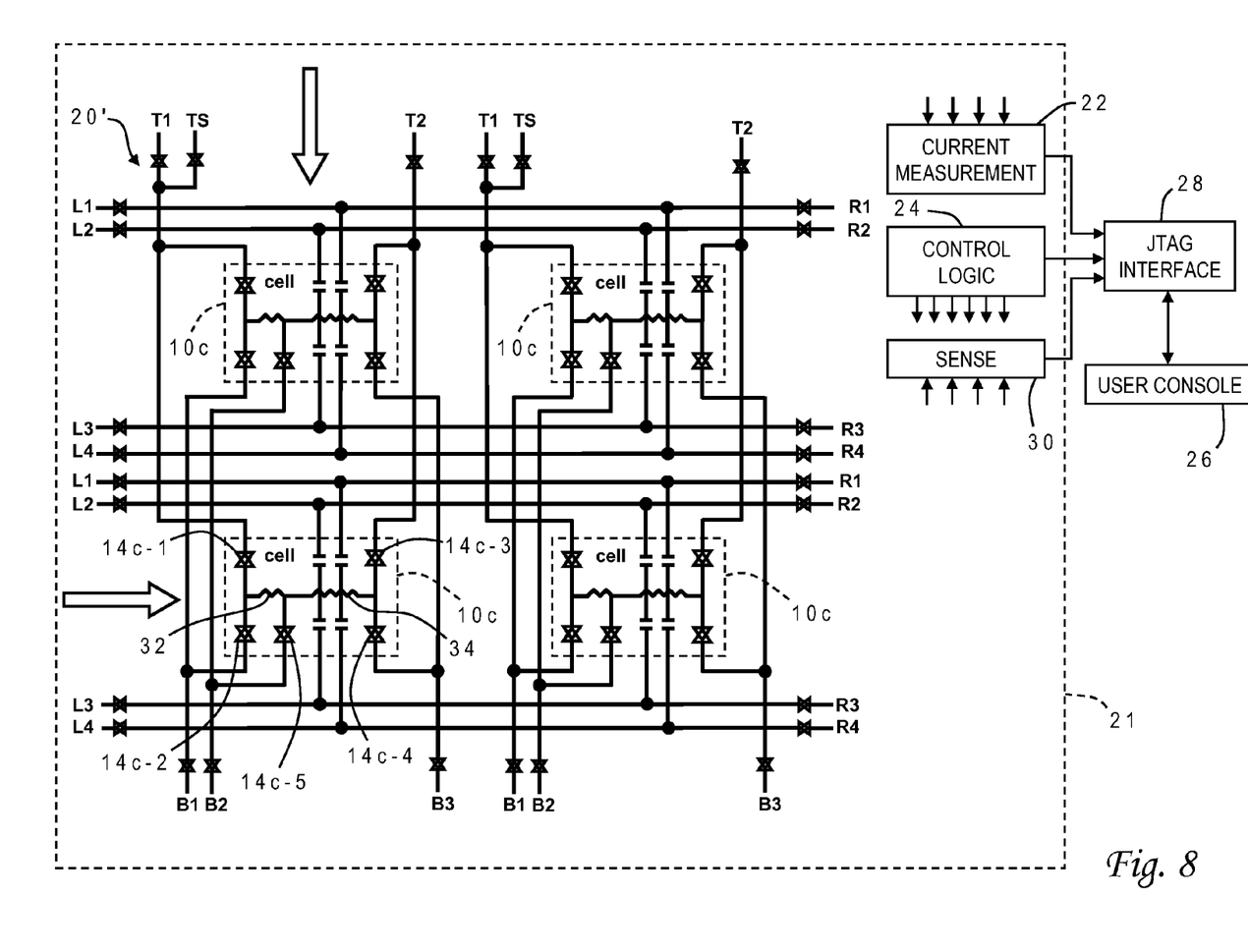
FIG. 8 is a schematic diagram of a test structure for measuring back-end of line (BEOL) capacitances in accordance with another embodiment of the present invention.

Referring now to FIG. 8, another test structure 20' is depicted having four test cells 10c. Test structure 20' is formed in an integrated circuit (IC) chip 21. Each test cell 10c has a via 32, a wire 34, a first set of pass gates 14c-1, 14c-2 connected to a terminal of via 32, a second set of pass gates 14c-3, 14c-4 connected to a terminal of wire 34, and a fifth pass gate 14c-5 connected to the node between via 32 and wire 34. Additional pass gates are used to couple respective input/output pins T1, T2, TS, B1, B2, B3, L1, L2, L3, L4, R1, R2, R3 and R4 to test structure 20'. Pins T1 and TS are selectively connected to pass gate 14c-1, pin T2 is selectively connected to pass gate 14c-3, pin B1 is selectively connected to pass gate 14c-3, pin B2 is selectively connected to pass gate 14c-5, pin B3 is selectively connected to pass gate 14c-4, pins L1 and R1 are selectively connected to the Metal Up input, pins L2 and R2 are selectively connected to the Metal Left input, pins L3 and R3 are selectively connected to the Metal Down input, and pins L4 and R4 are selectively connected to the Metal Up input.

For capacitance measurements, pin T1 is the current source while pin B1 is the current sink, pin TS is used for DUT isolation, and the remaining pins are used as aggressors depending on the particular capacitance parameter being measured, i.e., L1 and R1 are Metal Up aggressors, L2 and R2 are Metal Right aggressors, L3 and R3 are Metal Down aggressors, and L4 and R4 are Metal Left aggressors. Pin T1 is the measurement port and is connected to a current measurement circuit 22. Capacitance is measured as described above, with the strobed reference voltages applied to the interconnect structure under test while measuring baseline and excited currents, and the constructed linear relationship between ΔI and f.

For resistance measurements, pin T1 is the measurement sink, pin T2 is used as the wire drive line, pin TS is again used for DUT isolation, pin B1 is used as the via sense line, pin B2 is used as the via-wire terminal sense line, and pin B3 is used as the wire sense line. The measured current and sensed voltage drop (across via 32, wire 34 or the entire interconnect structure) are used to compute resistance according to the equation R=V/I.

Figure 9:
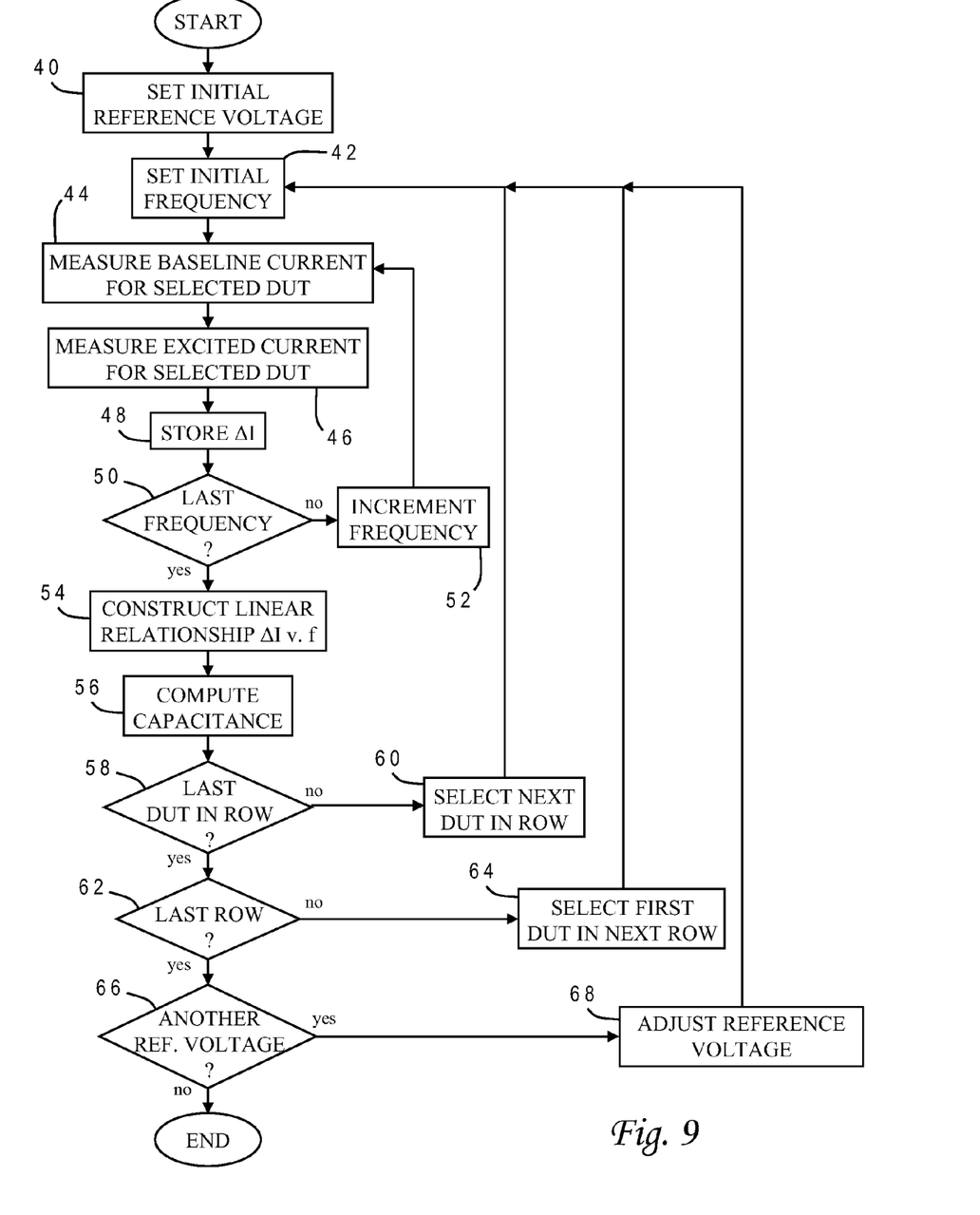
FIG. 9 is a chart illustrating the logical flow according to one implementation of the present invention.

The novel capacitance measurement technique of the present invention may be further understood with reference to the flow chart of FIG. 9. The process begins by setting the reference voltage, e.g., Gate Up and Gate Down (40), and setting the initial frequency for the strobing signals (42). The baseline current is measured for the selected DUT with no excitation voltage (44). The current is then measured with an excitation voltage (46). The difference between these two current measurements is stored in association with the strobing frequency (48). If there is not yet a final data point for the ΔI versus f plot (50), the frequency is incremented and the measurements are repeated (52). Once the last frequency is reached, the linear relationship between current difference and frequency is constructed (54), and capacitance is computed by dividing the slope of that line by the excitation voltage (56). If the DUT is not the last DUT in the row (58), then the next DUT in that row is selected for testing next (60), and the measurements and capacitance computation are repeated for that next DUT. Once all devices in the current row have been tested and if there is another row remaining (62), testing moves to the first DUT in the next row (64). The measurements and computations are repeated in this manner until all rows of DUTs have been test. If testing at other bias points is desired (66), the entire procedure is repeated after adjusting the reference voltage (68).

Many different capacitances can be characterized using the test structures of the present invention. Since the measurement pin and excitation pin for each implementation are separate the error tolerance is greatly reduced, and since there are no switches inside each DUT the micro-environment is preserved with minimal disturbance. All of the control signals are on the periphery of the array, making the invention easy to implement for large numbers of devices. These test structures also have the particularly beneficial ability to measure the C-V and I-V characteristics using the same array.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention has been described in the context of FEOL (transistor) and BEOL (interconnect) testing, but the DUT may be any circuit element or even more complicated circuit structures such as static random-access memory (SRAM) devices. It is therefore contemplated that such modifications can be made without departing from the spirit or scope of the present invention as defined in the appended claims.

What is claimed is:

1. A method of testing a plurality of electronic devices in an integrated circuit wherein the electronic devices are arranged in an array of columns and rows, comprising:
    selectively measuring a capacitance-voltage parameter for each of the electronic devices; and
    selectively measuring a current-voltage parameter for each of the electronic devices;
    wherein the capacitance-voltage parameter is measured by deriving a charge stored at a first node of a selected electronic device based on baseline and excited current measurements taken for different frequencies of a known excitation voltage that is applied to a second node of the selected electronic device.

2. A method of testing a plurality of electronic devices in an integrated circuit wherein the electronic devices are arranged in an array of columns and rows, comprising:
    selectively measuring a capacitance-voltage parameter for each of the electronic devices; and
    selectively measuring a current-voltage parameter for each of the electronic devices;
    wherein the current-voltage parameter is measured using current steering to direct current flow from a first node of a selected electronic device to a measurement unit while directing current flow from other electronic devices to a sink, and using voltage sensing to calibrate a reference voltage which is applied to a second node of the selected electronic device.

3. A method of testing a plurality of electronic devices in an integrated circuit wherein the electronic devices are arranged in an array of columns and rows, comprising:
    selectively measuring a capacitance-voltage parameter for each of the electronic devices; and
    selectively measuring a current-voltage parameter for each of the electronic devices;
    wherein a given one of the electronic devices is selected for measurement by column/row addressing logic which gates input/output pins at a periphery of the array, and the column/row addressing logic lies outside of the array.

* * * * *